US 6,656,782 B2

(12) United States Patent
Skotnicki et al.

(10) Patent No.: US 6,656,782 B2
(45) Date of Patent: Dec. 2, 2003

(54) PROCESS FOR MANUFACTURING AN ISOLATED-GATE TRANSISTOR WITH AN ARCHITECTURE OF THE SUBSTRATE-ON-INSULATOR TYPE, AND CORRESPONDING TRANSISTOR

(75) Inventors: Thomas Skotnicki, Crolles Montfort (FR); Stéphane Monfray, Grenoble (FR); Alexandre Villaret, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/084,255

(22) Filed: Feb. 27, 2002

(65) Prior Publication Data
US 2002/0135020 A1 Sep. 26, 2002

(30) Foreign Application Priority Data
Feb. 28, 2001 (FR) .............................. 01 02745

(51) Int. Cl.⁷ ......................................... H01L 21/8238
(52) U.S. Cl. ..................... 438/221; 438/222; 438/416; 438/421; 438/422
(58) Field of Search ............................... 438/222, 197, 438/151, 199, 221, 416, 421, 422; 257/347, 288

(56) References Cited

U.S. PATENT DOCUMENTS

| 5,955,745 A | 9/1999 | Yamazaki .................... 257/63 |
| 6,057,214 A | 5/2000 | Joyner ........................ 438/506 |

FOREIGN PATENT DOCUMENTS

| FR | 2795554 | 12/2000 | ......... H01L/21/336 |
| FR | 2795555 | 12/2000 | ......... H01L/21/336 |

OTHER PUBLICATIONS

M.Jurczak, T. Skotnicki, M. Paoli, B. Tormen, J–L. Regolini, C. Morin, A. Schiltz, J. Martins, R. Pantel, and J. Galvier, "SON (Silicon On Nothing)—A New Device Architecture for the ULSI Era," Digest Technical Papers, Symp. on VLSI Tech., (1999),pp. 29–30.*

M. Jurczak, T. Slotnicki, M. Paoli, B. Tormen, J.–L. Regolini, A Schlitz, J. Martins, R. Pantel, and J. Galvier, "SON (Silicon On Nothing)—A New Device Architecture for the ULSI Era," Digest Tech. Papers, Symp. on VLSI Tech. (1999) pp. 29–30.*

MOS Transistors with Bottom–Isolated Source/Drain Regions, Research Disclosure, Kenneth Mason Publications, Hampshire, GB, No. 398, Jun. 1, 1997, pp. 378–379, XP000726504.

Jurczak et al, SON (Silicon on Nothing), A New Device Architecture for the ULSI Era, 1999 Symposium on VLSI Technology, Digest of Technical Papers, Kyoto, Jun. 14–16, 1999, New York, 1999, pp. 29–30, XP000949338.

* cited by examiner

*Primary Examiner*—Tom Thomas
*Assistant Examiner*—Thomas Magee
(74) *Attorney, Agent, or Firm*—Lisa K. Jorgenson; Allen, Dyer, Doppelt, Milbrath & Gilchrist, P.A.

(57) ABSTRACT

The source, drain and channel regions are produced in a silicon layer, completely isolated vertically from a carrier substrate by an insulating layer, and are bounded laterally by a lateral isolation region of the shallow trench type.

19 Claims, 5 Drawing Sheets

PROCESS FOR MANUFACTURING AN ISOLATED-GATE TRANSISTOR WITH AN ARCHITECTURE OF THE SUBSTRATE-ON-INSULATOR TYPE, AND CORRESPONDING TRANSISTOR

FIELD OF THE INVENTION

The invention relates to integrated circuits, and more particularly, to isolated-gate transistors (MOS transistors), especially those having an architecture of the substrate-on-insulator (SOI) type, produced on a thin silicon film isolated from the substrate by a thin insulating layer.

BACKGROUND OF THE INVENTION

The advantage of SOI type architectures is that they make transistors operate in a fully depleted mode, making it possible to considerably reduce the effects of short channels for technologies below 0.1 micron. In conventional processes for fabricating a substrate-on-insulator, the thickness of the thin silicon film (corresponding to the conduction channel of the transistor), which is isolated from the substrate by a thin insulating layer, cannot be reproducibly controlled and uncertainties on the order of 20 nm are found in the devices finally produced.

Moreover, at the present time the various substrate-on-insulator transistors produced in this way are mutually isolated laterally by isolation regions of the LOCOS (local oxidation of the substrate) type, which, as is well known to those skilled in the art, has regions in the form of a bird's beak. However, such lateral isolation encourages the appearance of large leakage currents and proves to be penalizing in terms of a footprint for the density of integration of the various transistors.

One approach is to produce lateral isolation regions of the shallow trench type, also well known to those skilled in the art, which are less penalizing with regard to leakage currents and to the density of integration. However, the production of such shallow trenches in a substrate-on-insulator proves destructive to the insulating film. Consequently, at the present time, production is limited to LOCOS type regions in substrates on an insulator.

SUMMARY OF THE INVENTION

In view of the foregoing background, an object of the invention is to produce transistors of the substrate-on-insulator type, with a silicon film and a buried dielectric which are very thin and have controlled thicknesses.

Another object of the invention is to produce these transistors between lateral isolation regions of the shallow trench type.

These and other objects, advantages and features of the invention are provided by a method of implementation that starts with a region of a substrate bounded laterally by lateral isolation regions of the shallow trench type. Then, a multilayer is formed on this substrate region. The multilayer is formed from a first layer comprising a silicon-germanium alloy surmounted by a second layer comprising silicon. The first layer of the multilayer will then be completely etched by selective etching and then filled with an insulating material. The source and drain regions and the channel region of the transistor will be produced in the second layer of the multilayer, and will thus be completely isolated vertically from the substrate by the layer of insulating material that has replaced the first layer of the multilayer. Moreover, the transistor thus produced will be isolated laterally from the other transistors by regions of the shallow trench type.

Furthermore, the invention has the advantage of producing the transistor without breaking the second layer of the multilayer within which the source, drain and channel regions are located. In other words, the continuity of this layer is preserved throughout the length of the process according to the invention. That is to say that there is in particular, at a given instant, no vertical etching of this layer followed by reforming of this layer, thereby making it possible to avoid the tricky technological problems of reconnecting the layer.

More generally, the invention provides a process for manufacturing an isolated-gate transistor comprising the formation, by selective epitaxy on the surface of an active region of a substrate bounded by a lateral isolation region of the shallow-trench type, of a multilayer comprising a first layer made of a silicon-germanium alloy surmounted by a silicon second layer. A gate oxide layer is formed on the multilayer, and a gate region is formed on the gate oxide layer and on the lateral isolation region.

The method further includes selectively etching the first layer of the multilayer so as to form a tunnel, and filling the tunnel with an insulating material.

The complete selective etching of the first layer of the multilayer is carried out from the edges of the lateral isolation region towards the gate. The step of selectively etching the first layer is advantageously preceded by a step of local deoxidation at the edges of the active region. The selective etching step is preferably carried out before the steps of implanting the source and drain regions. The thickness of the second layer may be on the order of tens of nanometers, for example, twenty nanometers.

The invention also provides an integrated circuit comprising an isolated-gate transistor, the source, drain and channel regions of which are produced in a silicon layer completely isolated vertically form a carrier substrate by an insulating layer and bounded laterally by a lateral isolation region of the shallow-trench type.

BRIEF DESCRIPTION OF THE DRAWINGS

Further advantages and features of the invention will appear on examining the detailed description of methods of implementation and embodiments, which are in no way limiting, and the appended drawings in which.

DETAILED DESCRIPTION OF THE PREFERRED EMBODIMENTS

Figure 1:
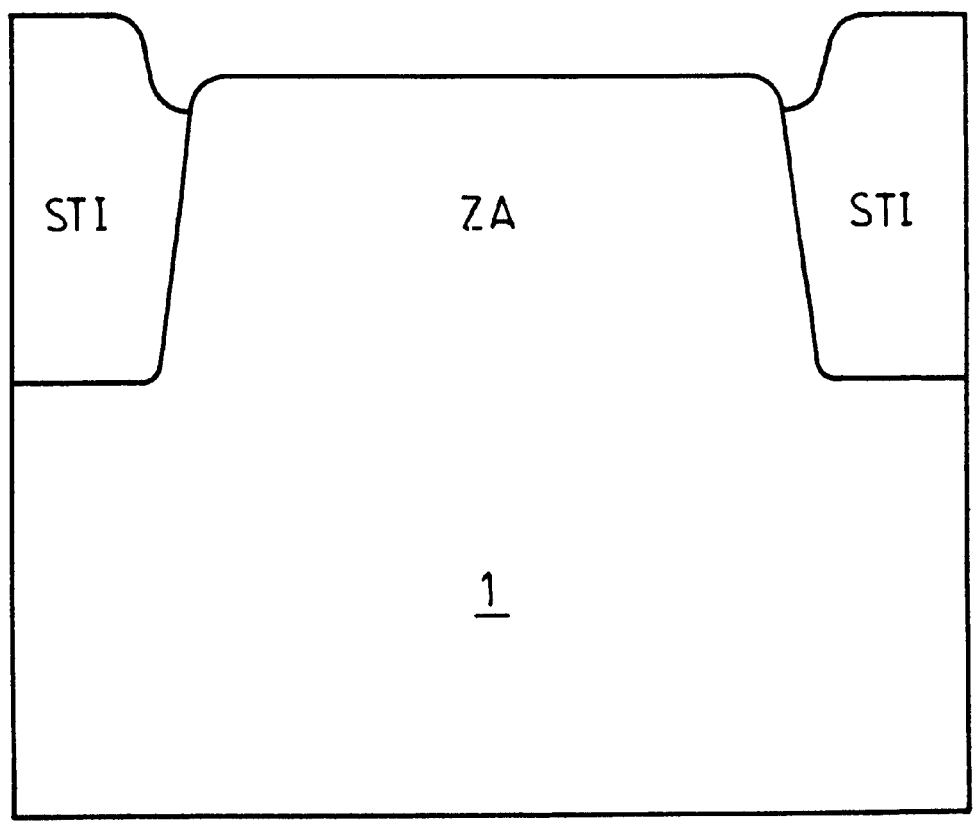
FIGS. 1, 2a, 2b, and 3 to 5 illustrate the main steps of implementing the process according to the invention for fabricating an isolated-gate transistor.

In FIG. 1, the reference 1 denotes a semiconductor substrate, for example, made of silicon and comprising a substrate region ZA bounded laterally by a lateral isolation region STI of the shallow trench type. The production of a such lateral isolation region STI is in itself completely known by those skilled in the art and will not be described here in detail.

Figure 2A:
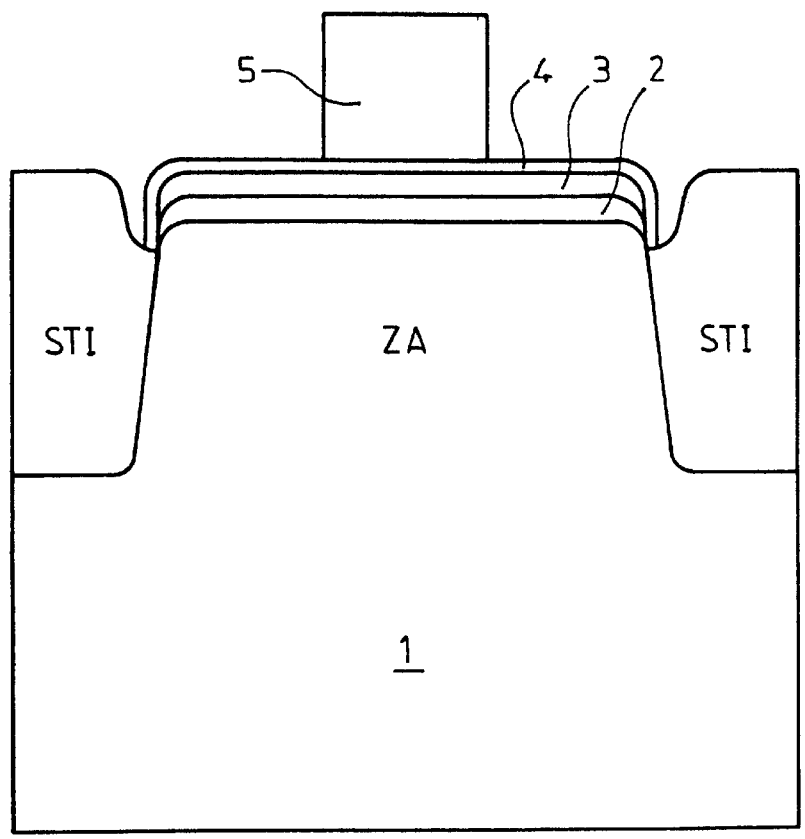

Starting from the structure illustrated in FIG. 1, a multilayer comprising a first layer 2 is formed from a silicon-germanium alloy, and is surmounted by a second layer 3 formed from silicon, as illustrated in FIG. 2a. These layers are formed by selective epitaxy, known by those skilled in the art. That is, the silicon-germanium grows only on the substrate region ZA and does not grow on the lateral isolation region STI. Likewise, the silicon layer 3 grows only on the silicon-germanium layer 2.

The respective thicknesses of the layer 2 and the layer 3 are on the order of 20 nm. In fact, the material forming the layer 2 is more generally a material that can be removed selectively with respect to silicon, and which preferably ensures that there is lattice continuity with the silicon during the epitaxy. Thus, $Si_{1-x}Ge_x$ alloy (where 0<x 1) may be chosen, for example. $Si_{1-x}Ge_x$ alloys are recommended as they can be easily removed selectively, either by a well-known oxidizing chemistry (such as a solution containing 40 ml of 70% $HNO_3$+20 ml $H_2O_2$+5 ml of 0.5% HF) or by isotropic plasma etching.

Preferably, $Si_{1-x}Ge_x$ alloys having a high germanium content will be used since the selectivity of the etching with respect to silicon increases with an increase in the germanium content in the alloy. It is also possible to use $Si_{1-x-y}Ge_xC_y$ alloys (where $0<x \leq 0.95$; $0<y \leq 0.05$) which behave like $Si_{1-x}Ge_x$ alloys with regard to selective removal but induce less stress with the silicon layers.

Figure 2B:
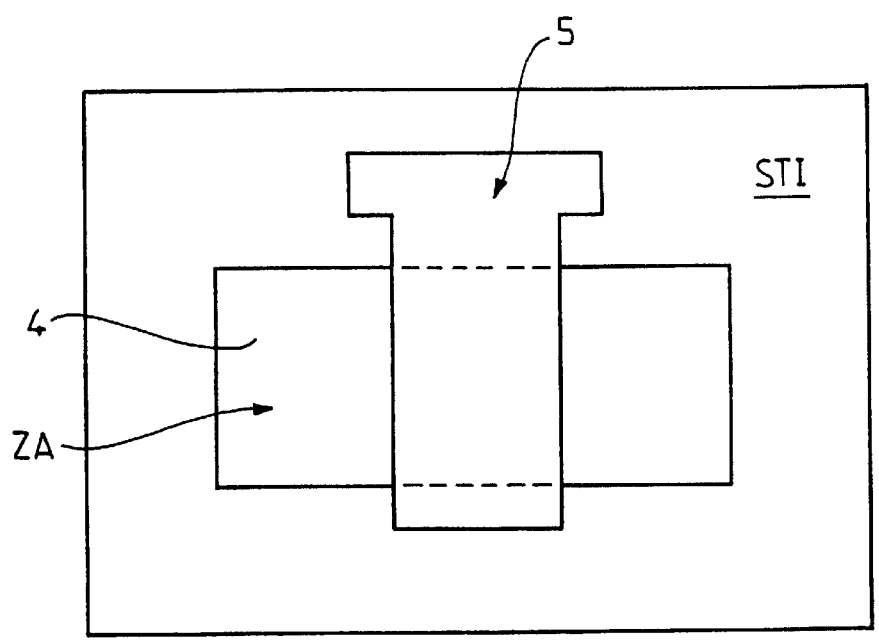

Next, an insulating layer 4 made, for example, from silicon dioxide is then formed by oxidation. This layer 4 covers the silicon layer 3 and will be used to form subsequently the gate oxide layer of the transistor. Next, the gate 5 of the transistor is produced conventionally by depositing a gate material, for example, polysilicon, and then by etching this material so as to form the gate. In this regard, as illustrated in FIG. 2b, which shows a plan view of the device of FIG. 2a, it may be seen that the gate 5 forms a bridge transversely straddling the substrate region ZA and bearing on the two sides of this region ZA on the lateral isolation region STI.

Figure 3:
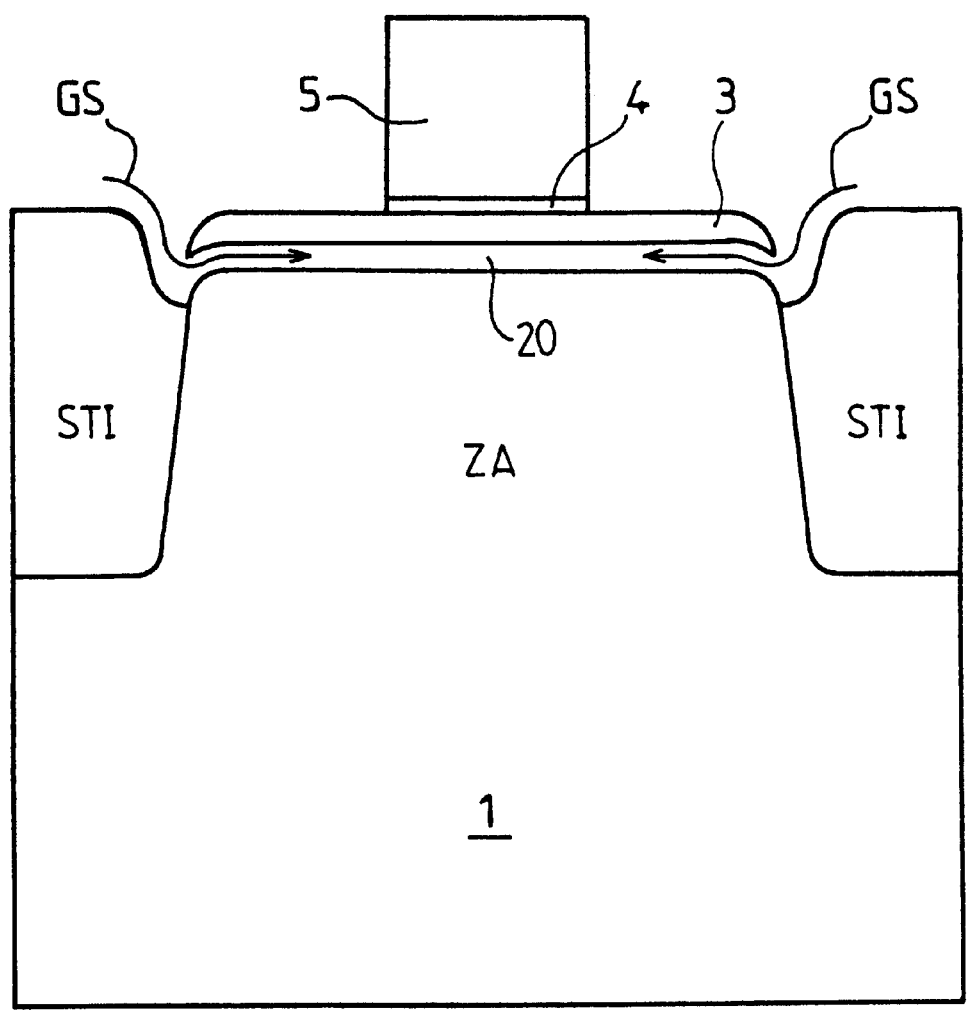

The next step (FIG. 3) comprises selectively etching the first layer 2 of the multilayer. This selective etching is illustrated by the arrows GS in FIG. 3. This selective etching may be carried out as indicated above by an oxidizing chemistry or else by an isotropic plasma etching, and will result in the complete removal of the layer 2 of the multilayer so as to form a tunnel 20 beneath the layer 3. This layer 3 is mechanically held by the gate 5, which rests, as indicated above, on the lateral isolation region STI.

It should be noted here that the selective etching GS of the silicon-germanium layer is preferably preceded by local deoxidation at the lateral isolation region STI, so as to be able to access the silicon-germanium layer 2 more easily. This is not detrimenal to the quality of the lateral isolation, since this lateral isolation is not critical because the transistor is insulated with respect to the substrate ZA. This local deoxidation results, in the method of implementation described here, in deoxidation of the structure resulting in shrinkage of the layer 4 on each side of the gate 5.

Figure 4:
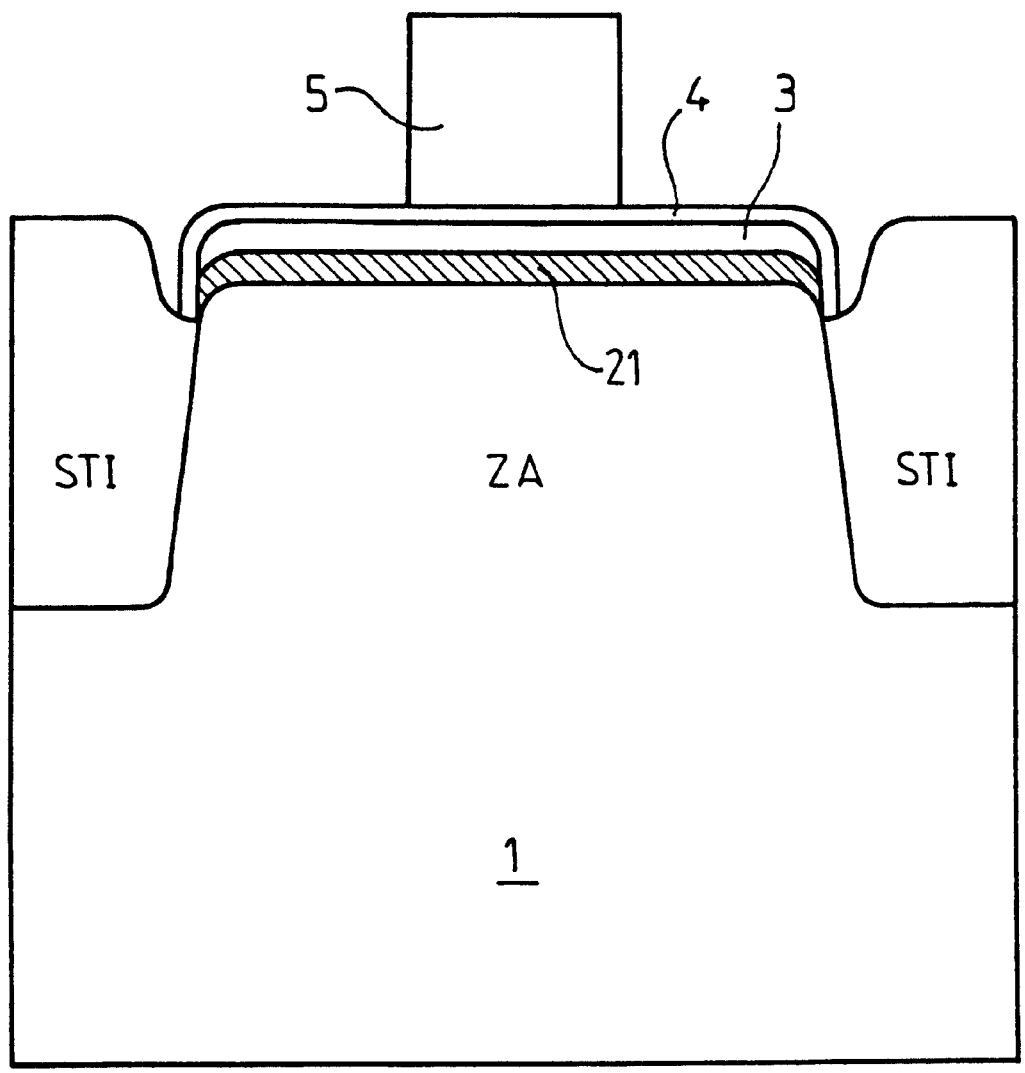

The etching of the tunnel 20 is followed by an oxidation so as to fill this tunnel with an insulating material 21 (FIG. 4), for example, with silicon dioxide. This oxidation also leads to the layer 4 being reformed. The insulating material 21 will ensure isolation of the conduction channel of the transistor which will be formed in the silicon layer 3.

Figure 5:
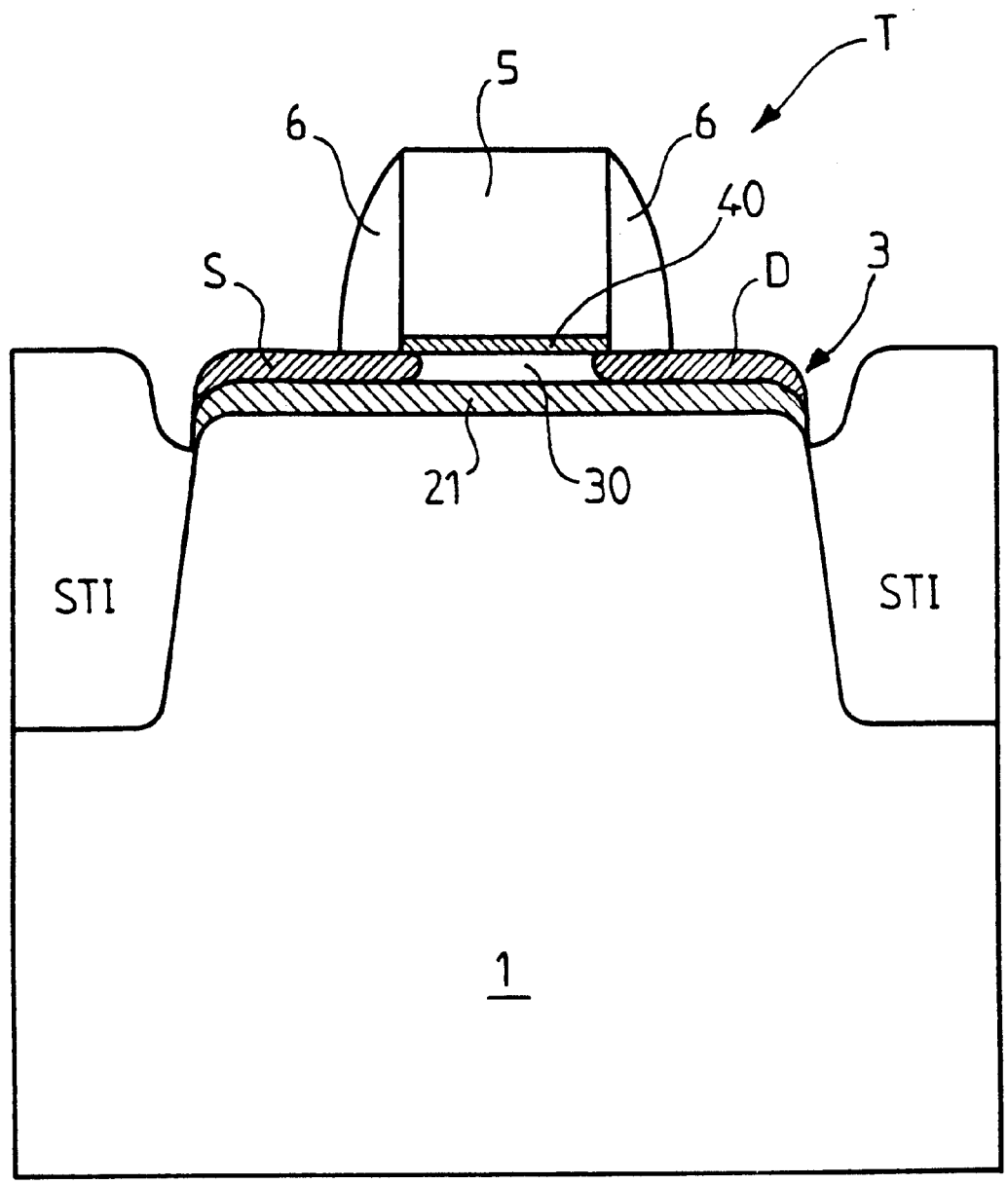

As illustrated in FIG. 5, the transistor T will then be completed in the conventional manner by a first implementation of dopants so as to form the source and drain extension regions. This first dopant implantation is followed by the formation of isolating spacers 6 flanking the edges of the gate 5. A second implantation of a higher dose will then be carried out on each side of the spacers, so as to form the source S and drain D regions. The subsequent steps include, in particular, of producing the metal contact areas on the source, drain and gate regions of the transistor.

The transistor T according to the invention has a conduction channel 30 isolated from the gate 5 by a gate oxide layer 40. This conduction channel itself is isolated from the substrate 1 by a layer 21 made of an insulating material. Moreover, the source S and drain D regions are also completely isolated vertically from the substrate by the insulating layer 21. Finally, the transistor T is isolated laterally from other transistors formed on the same integrated circuit by lateral isolation regions STI of the shallow trench type.

The invention is not limited to the methods of implementation and embodiments that have just been described, but embraces all the variations thereof. Thus, although it is preferable to carry out the implantations of the source and drain extension regions and the source and drain implantations after the step of etching the tunnel, so as to again obtain better silicon-germanium etching selectivity with respect to silicon, it would also be conceivable to produce the transistor entirely before etching the first layer of the multilayer 2 so as to form the tunnel 20.

That which is claimed is:

1. A process for fabricating an isolated-gate transistor comprising:
    forming a multilayer on a surface of a substrate bounded by a lateral isolation region of a shallow trench type, the multilayer comprising a first layer comprising a silicon-germanium alloy, and a second layer comprising silicon on the first layer;
    forming a gate oxide layer on the second layer;
    forming a gate on the gate oxide layer and on the lateral isolation region;
    removing the first layer for forming a tunnel under the second layer;
    filling the tunnel with an insulating material so that the transistor is isolated vertically from the substrate; and
    forming source and drain regions in the second layer.

2. A process according to claim 1, wherein removing the first layer comprises selectively etching the first layer from edges of the lateral isolation region towards the gate.

3. A process according to claim 1, wherein the multilayer is formed by a selective epitaxy.

4. A process according to claim 1, further comprising performing a local oxidation at edges of the surface of the substrate bounded by the lateral isolation region.

5. A process according to claim 1, wherein a thickness of the second layer is less than or equal to 20 nanometers.

6. A process for fabricating an isolated-gate transistor comprising:
    forming a multilayer on a surface of a substrate bounded by a lateral isolation region of a shallow trench type, the multilayer comprising a first layer and a second layer on the first layer;
    forming a gate oxide layer on the second layer;
    forming a gate on the gate oxide layer and on the lateral isolation region;
    removing the first layer for forming a tunnel under the second layer;
    filling the tunnel with an insulating material so that the transistor is isolated vertically from the substrate; and
    forming source and drain regions in the second layer after the tunnel has been filled with the insulating material.

7. A process according to claim 6, wherein the first layer comprises a silicon-germanium alloy.

8. A process according to claim 6, wherein the second layer comprises silicon.

9. A process according to claim 6, wherein removing the first layer comprises selectively etching the first layer from edges of the lateral isolation region towards the gate.

10. A process according to claim 6, wherein the multilayer is formed by a selective epitaxy.

11. A process according to claim 6, further comprising performing a local oxidation at edges of the surface of the substrate bounded by the lateral isolation region.

12. A process according to claim 6, wherein a thickness of the second layer is less than or equal to 20 nanometers.

13. A process for fabricating an isolated-gate transistor comprising:

forming a multilayer on a surface of a substrate bounded by a lateral isolation region of a shallow trench type, the multilayer comprising a first layer and a second layer on the first layer;

forming a gate oxide layer on the second layer;

forming a gate on the gate oxide layer and on the lateral isolation region;

forming source and drain regions in the second layer;

removing the first layer for forming a tunnel under the second layer; and filling the tunnel with an insulating material so that the transistor is isolated vertically from the substrate, the tunnel being filled after the source and drain regions have been formed in the second layer.

14. A process according to claim 13, wherein the first layer comprises a silicon-germanium alloy.

15. A process according to claim 13, wherein the second layer comprises silicon.

16. A process according to claim 13, wherein removing the first layer comprises selectively etching the first layer from edges of the lateral isolation region towards the gate.

17. A process according to claim 13, wherein the multilayer is formed by a selective epitaxy.

18. A process according to claim 13, further comprising performing a local oxidation at edges of the surface of the substrate bounded by the lateral isolation region.

19. A process according to claim 13, wherein a thickness of the second layer is less than or equal to 20 nanometers.

* * * * *